United States Patent [19]

Gaule et al.

[11] 4,155,017
[45] May 15, 1979

[54] SHARPENING HIGH POWER PULSES

[75] Inventors: Gerhart K. Gaule, Elberon; Sol Schneider, Little Silver; Stephen Levy, Ocean, all of N.J.

[73] Assignee: The United States of America as represented by the Secretary of the Army, Washington, D.C.

[21] Appl. No.: 849,820

[22] Filed: Nov. 9, 1977

[51] Int. Cl.² .................. H03K 5/12; H03K 5/08; H03K 6/04

[52] U.S. Cl. ........................... 307/268; 307/263; 307/363

[58] Field of Search ........... 307/256, 263, 268, 363; 361/6, 110, 111, 117, 118, 126, 127

[56] References Cited

U.S. PATENT DOCUMENTS

| | | | |
|---|---|---|---|
| 3,385,982 | 5/1968 | Raillard et al. | 307/268 X |
| 3,509,351 | 4/1970 | Stuckert | 307/268 X |
| 3,644,747 | 2/1972 | Gray | 307/268 X |
| 3,686,516 | 8/1972 | Guadagnolo | 307/263 |
| 3,849,732 | 11/1974 | Pezot | 307/263 X |
| 3,962,715 | 6/1976 | Raccah et al. | 357/61 X |
| 3,973,224 | 8/1976 | Gaule et al. | 361/111 X |

OTHER PUBLICATIONS

Gaule et al., *IEEE Int'l Pulse Power Conference;* 11/1976.

Gaule et al., 1976 *IEDM Technical Digest;* pp. 279-282; 12/1976.

*Primary Examiner*—Larry N. Anagnos
*Attorney, Agent, or Firm*—Nathan Edelberg; Sheldon Kanars; Bernard Franz

[57] ABSTRACT

A metal oxide threshold switch (MOTS, e.g., $NbO_x$, x preferably fractionally less than 2) series connected is used to sharpen the pulse rise to about one nanosecond, with a peak of thousands of volts, and up to 100 amperes or more. A trigger pulse is used to further sharpen the pulse and reduce jitter.

10 Claims, 10 Drawing Figures

SHARPENING HIGH POWER PULSES

BACKGROUND OF THE INVENTION

This invention relates to sharpening the rise time of high voltage, high current pulses.

The interest in nanosecond high voltage pulse generators is rapidly increasing. At the present time, they are used in quantum physics, in nuclear physics, in particle accelerators, in x-ray generators, in high-speed photography, etc. The possibility of applying nanosecond generators to solve certain problems in experimental physics such as the production of powerful pulse lasers, strong-current accelerators of charged particles, and fast heating of plasma is of extreme interest. These pulses are also of interest for radar. The state of the art is covered by a book "Formation of Nanosecond Pulses of High Voltage" by G. A. Mesyats, A. S. Nasibor and V. V. Kremnev, translation available from National Technical Information Service, Springfield, Va. 22151, as document No. AD 733 130.

A circuit using spark gaps and a type of triggering is shown in the above mentioned book in FIG. 5–6 described on pages 160-162 of the translation.

A conventional (silicon) solid state device in a pulsesharpening circuit would, because of its 100 to 1000 picofarad capacitance, cause intolerable pre-switching currents. Pulsesharpening with gaseous devices is unsatisfactory because of the long and uncertain switch-on delay (several nanoseconds) with these devices. Therefore pulses from conventional power sources for lasers and radars are not sharpened—they have a much longer than optimal risetime.

SUMMARY OF THE INVENTION

The object of the invention is to provide shorter risetimes with more time precision (less jitter), while at the same time reducing complexity, cost and size of a pulser circuit.

According to the invention, a metal oxide threshold switch (MOTS) is connected in series between a pulse generator and a load.

One type of MOTS uses $NbO_x$ (x equal to or preferably fractionally less than 2) as the switching material, either as a thin film formed on NbO, or in bulk form. The threshold voltage may be from about 60 volts up to several hundred volts and even kilovolts, with a current in the "ON" state of several amperes or more than 100 amperes. The "OFF" state capacitance is only a few picofarads, and the switching time less than a nanosecond. A separate trigger pulse source is used to more precisely determine the time that the MOTS switches into conduction, to thereby virtually eliminate any jitter.

DETAILED DESCRIPTION

Further information on the operation of metal oxide threshold switches and some applications is found in two papers by G. Gaule', P. LaPlante, S. Levy and S. Schneider; the first titled *Pulse Sharpening with Metal-Oxide Bulk Switching Devices* in IEEE International Pulse Power Conference, Nov. 1976; and the second titled *Metal Oxide Devices for Rapid High Current Switching* in the 1976 IEDM Technical Digest, pages 279-282, publishesd Dec. 1976. These papers are made a part hereof. They include a disclosure of the invention claimed herein.

Metal oxide threshold switches, MOTS, have been used to suppress transient pulses such as induced by lightening, etc. See, for example, U.S. Pat. No. 3,973,224. When applied in that manner, the device is placed in shunt across a transmission line to absorb the transient pulse current, and thereby protect a load device at the end of the line.

When a metal oxide threshold switch is subjected to a fast rising pulse from a low impedance source, it goes from a high impedance state (characterized by typically 100 kilohms to one megohm in parallel with 1 to 4 picofarads) to a low impedance within less than a nanosecond. The voltage then appears "clamped" to the threshold value, and subsequently drops to a "holding voltage" of typically 20 volts. After termination of the applied pulse, the high impedance state, and the previous threshold voltage value is essentially recovered within typically 6 miscroseconds.

The metal-oxide (MOX) chip typically is a NbO (a semiconductor, acting as ohmic contact) crystal with a 10 micrometer $NbO_x$ layer thermally grown on top by oxidation. (See U.S. Pat. No. 3,962,715.) The stoichiometric value of x is 2, but values lower than that, for example x equal to about 1.9 have been found preferable for switching material. The thin film form yields threshold voltages from 80 to 600 volts. For higher voltages, single crystal chips of $NbO_x$ are used. Threshold voltages are controlled by the thickness of di-oxide and also the deviation from stoichiometry. The current flow in the low impedance state is typically several amperes, and values of 250 amperes have been sustained.

Figure 1:
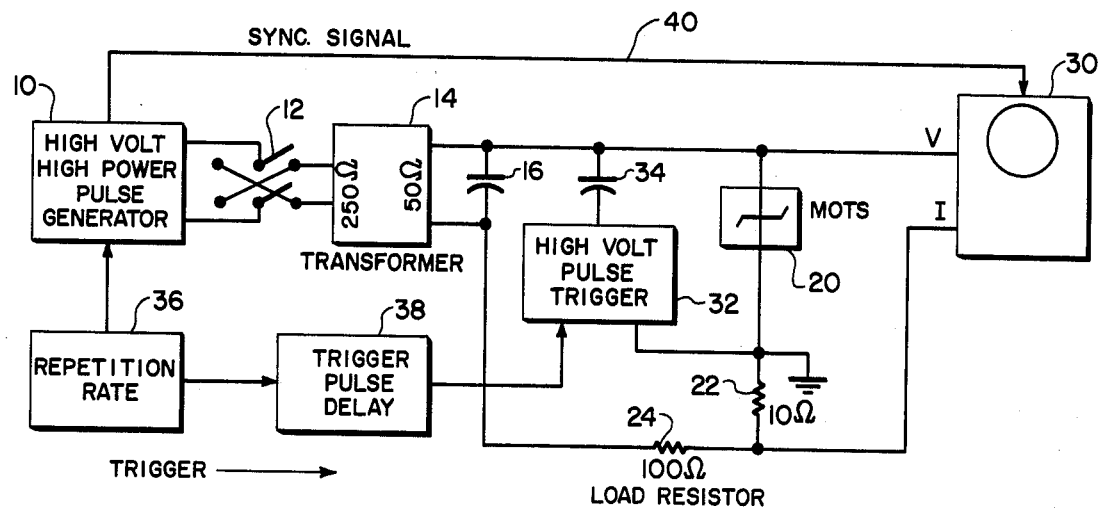
FIG. 1 is a block and schematic drawing of an embodiment of the invention.

Referring now to FIG. 1, the basic circuit comprises a pulse generator 10 supplying pulses to a load represented by a 100-ohm resistor 24. To sharpen the pulses, a metal oxide threshold switch device 20, for example, a $NbO_x$ device, is connected in series between the source and the load.

In an experimental arrangement, a Cober pulse generator 10, type 605-P, was set to produce a slowly rising pulse (100 nanoseconds). The reversing switch 12, transformer 14, and 1500-picofarad capacitor 16 may be included as a part of the pulse source. To observe the results, an oscilloscope, Tektronix type 7904, and a 10-ohm resistor 22 are connected as shown.

Figures 2A, 2B:
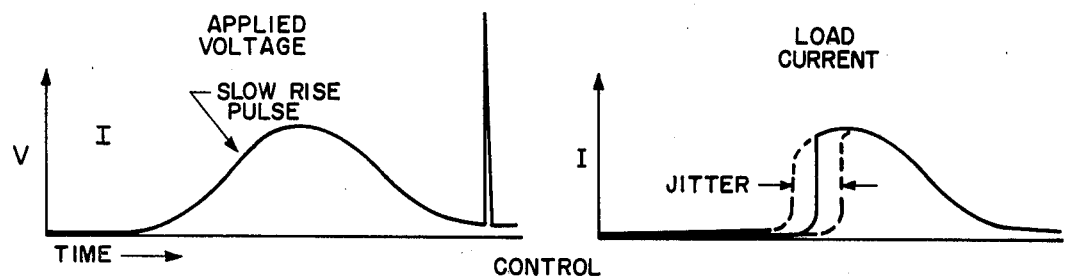
FIGS. 2A, 2B, 2C, 2D, 2E and 2F are graphs of voltage and current waveforms.

The applied voltage from the pulse source is shown in FIG. 2A (slow rise pulse). The effectiveness of pulse sharpening is tested by replacing the MOTS device 20 with a short. In that case the shape of the current pulse resembles that of the applied voltage. Insertion of the MOTS device 20, without any trigger pulse superimposed, causes sharpening of the current pulse, as shown in FIG. 2B. The current rise time is thus reduced to a few nanoseconds. During repetitive pulsing there is some variation in the time of the onset of the sharp rise of the current (jitter). This "time jitter" can be quite small compared to that obtained with prior high voltage, high current switching devices, such as spark gaps.

It has been found that the time of initiation of the current pulse front can be made very stable by use of a superimposed trigger pulse. A pulse trigger source 32 is coupled to the input side of the MOTS device 20 via an insolating 100-picofarad capacitor 34. Instead of capacitor 34, other suitable isolation may be provided, so that effectively the trigger pulse is from a high impedance source, so that the power requirement is relatively low, and does not shunt power from the main pulse source 10. Both the main pulse from source 10 and the trigger pulse from source 32 are initiated from a circuit 36, and the trigger source 32. A synchronization signal (lead 40) is supplied to the oscilloscope 30 from the main pulse source 10.

Figure 3:
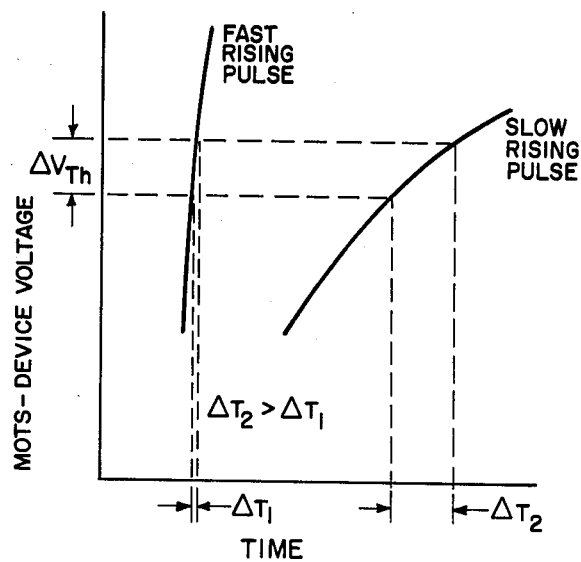
FIG. 3 is a graph showing the efffect of the pulse rise time on the threshold voltage.

In the case in which the trigger pulse occurs after the main pulse, as shown in FIG. 2A, the current pulse (FIG. 2B) is the same as with no trigger pulse. Apparently the MOTS threshold voltage undergoes random variations within a range of $V_{th}$ from pulse to pulse. These cause the time jitter within a range $\Delta T_2$ for a slowly rising pulse (FIG. 3). On the other hand, a fast rising pulse virtually eliminates time jitter ($\Delta T_1$ in FIG. 3). Generally, time jitter will be a small fraction of the pulse rise time.

Figures 2C, 2D:
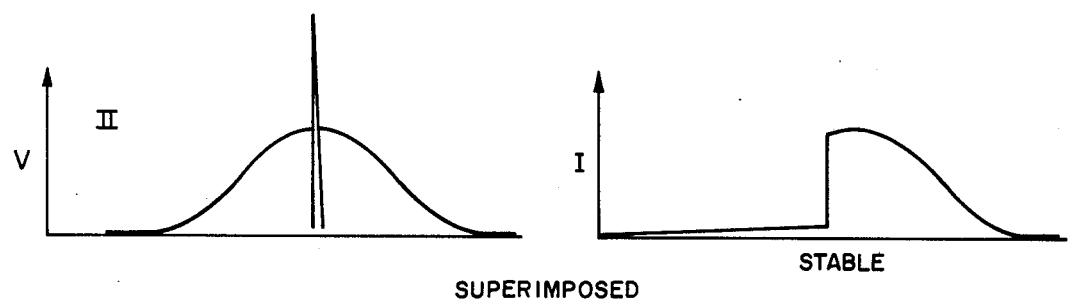

Superimposing a fast over a slow rising pulse (FIG. 2C) can thus make time jitter in the switch onset unnoticeable, as shown for the current pulse in FIG. 2D. The fast trigger pulse (approximately one nanosecond risetime, approximately one nanosecond duration, peak approximately two times the MOTS threshold voltage) is superimposed by the trigger pulse source 32, such as a cable pulser, isolated from the main pulse source by a small capacitor 34 or other suitable means. The trigger pulse delay is adjusted for optimum pulse shape and stability (FIGS. 2C and 2D). Mutual pulse polarity is not a major influence.

It is possible to set the peak voltage of the main pulse to less than the MOTS threshold voltage. In that case, no switching occurs without the trigger pulse. Also, preswitching leakage current through the MOTS device 20 is reduced. Also, setting the main voltage pulse at a sub-threshold level, gives considerable freedom in precisely shaping the current pulse by shifting the one-nanosecond risetime trigger pulse to optimal position.

Figures 2E, 2F:
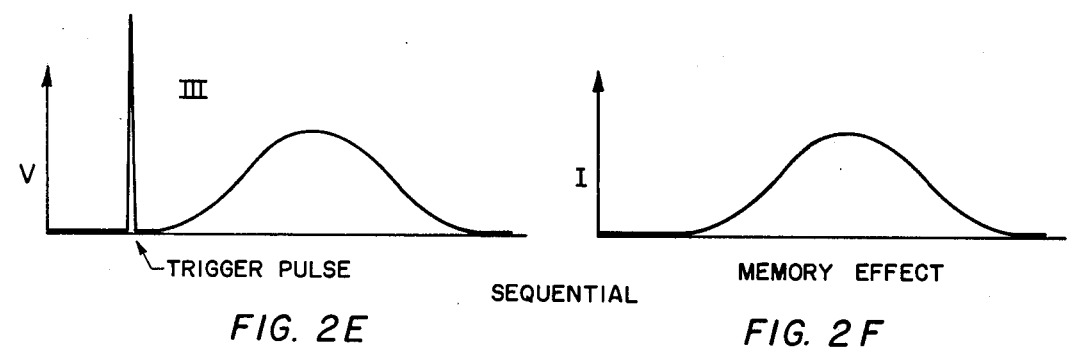

Pre-switching, by virtue of the recovery effect described earlier, is also possible (FIG. 2E), which causes the MOTS device to act as a short for the subsequent main pulse, with a resulting current pulse as shown in FIG. 2F.

With the MOTS device 20 in series with the pulse sources, the risetime of a 2.5 kilovolt, 20 ampere pulse was reduced from 150 to 2 nanoseconds. Pulse repetition frequencies to 10 kilohertz were applied at small currents. With proper triggering, time jitter became unnoticeable, and less than that of existing devices.

The trigger pulse source 32 may be a cable pulser, comprising a direct current power supply, a length of 50-ohm coaxial cable with a charging load such as a one megohm resistor in series between the D.C. power supply and the center conductor at the cable input, and a reed relay or gas driven cable discharge switch at the cable output, followed by a 50-ohm termination. The output is taken from a branch between the switch and the termination. The pulse time depends on the length of the cable. By shortening the cable length to about 30 centimeters, a suitable trigger pulse is obtained.

For other suitable trigger pulse sources, see "High Speed Pulse Technol." Vol I by Frank Früngel, Acad. Press, NYC 1965 p. 234–249. See also Proc. Royal Soc. vol. A328, 97–121, 1972, D. J. Bradley et al. A "Transmission Line Pulser" Model 125 is manufactured by SPIRE Corp., Patriotic Park, Burl., MA.

For high threshold voltages, a three terminal device can be synthesized from two MOTS devices by putting them in series. The advantage of this arrangement is the high input impedance for the trigger input with both MOTS devices are in the "off" state. If the MOTS device off state resistances approximately are $R_O$, for example approximately 20 kilohms, the trigger input resistance is $R_O/2$, or approximately 10 kilohms. The trigger pulse generator can thus be relatively high impedance, say one kilohm, and the energy about 45 microjoules. Most MOTS devices will be used in conjunction with transmission lines, and these transmission lines may have impedances as low as 3 or 7 ohms.

Figure 4:
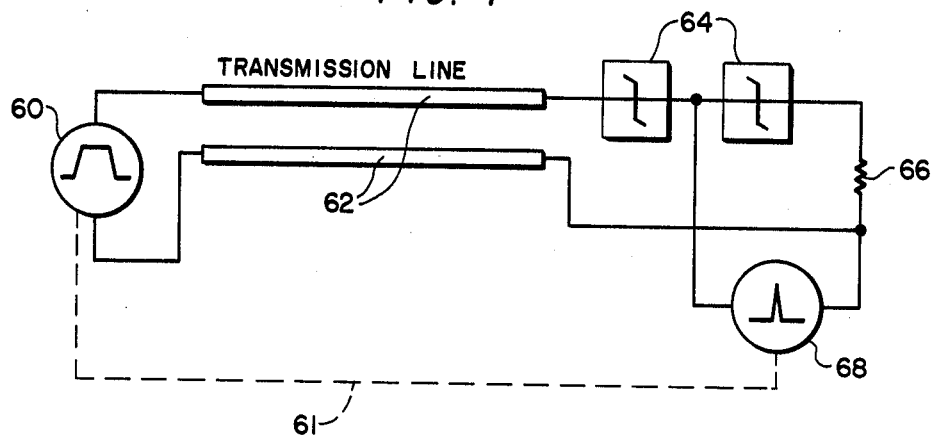
FIGS. 4 and 5 show embodiments of the invention with MOTS devices connected in series.

FIG. 4 illustrates the application of two MOTS devices in series for pulse sharpening. The main pulse source 60 and trigger pulse source 68 correspond respectively to the pulse generator 10 and trigger generator 32 of FIG. 1. The source 60 and load 66 typically have the same impedance as the transmission line 62 connecting them. The trigger source 68 is connected to the junction of the two MOTS devices 64. The dashed line 61 represents the means for applying an advance trigger signal synchronized with the main pulse source 60. A predetermined delay and pulse repetition may be provided such as shown in FIG. 1. If the main source 60 supplies 4 kilovolt pulses, the MOTS devices 64 may have a threshold voltage of two kilovolts, and the trigger may be three kilovolts. A 100 nanosecond pulse from the main source 60 may be sharpened by applying the trigger at the appropriate time, as explained in conjunction with FIG. 1.

Figure 5:
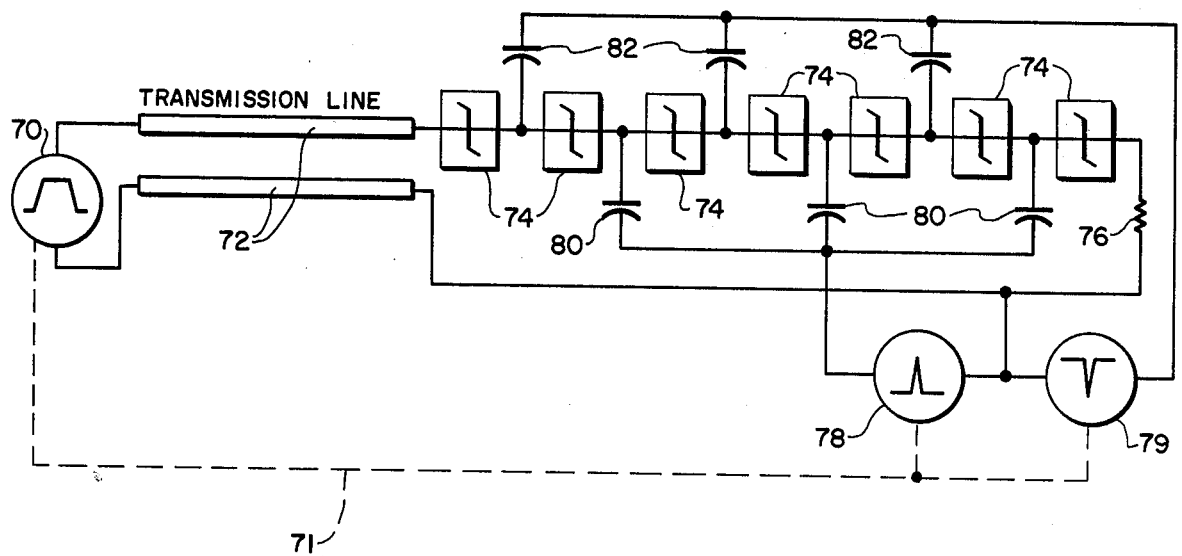

In FIG. 5 there is shown a system similar to that of FIG. 4, with a high voltage chain of seven MOTS devices with alternately applied positive and negative trigger pulses. The pulse to be sharpened is supplied from a main source 70 via a transmission line 72 and the MOTS chain 74 to the load 76. Positive trigger pulses are supplied from source 78 via decoupling capacitors 80 to alternate MOTS junction points; and negative trigger pulses are supplied from source 79 via decoupling capacitors 82 to the junction points intermediate those having positive triggers. Again, switch-on is precisely timed via trigger timing means represented by dashed line 71 as in the other figures. High threshold voltage MOTS devices can be used to keep leakage currents down, and relatively low energy (but high voltage such as 3 kilovolts) trigger pulses from medium trigger generators are sufficient to control the switching system. "N" number of MOTS devices can be used in a high voltage chain, where "N" is determined by the hold-off voltage of the chain divided by the hold-off voltage of individual MOTS devices.

Thus FIGS. 4 and 5 show arrangements in which the voltage and energy required from a trigger pulse source (for example, a cable pulser) can be reduced when MOTS devices are linked in series and the trigger pulse is applied to the link. When all MOTS devices are "OFF" the trigger generator and the main pulse source are effectively decoupled from each other. The trigger generator is connected to a high impedance "load" until at least one of the MOTS devices is fully triggered, or has entered the initial high current regime. The MOTS device which is (or are) still off at that time carry the full voltage drop from the main pulse and go "on" subsequently. When all MOTS devices are "on" the relatively high source impedance of the trigger generator prevents it from absorbing a substantial part of the main pulse.

What is claimed is:

1. Pulse sharpening means for a circuit in which a pulse source supplies high voltage, high current pulses to a load; the pulse sharpening means comprising a metal oxide threshold switch device connected in series between the pulse source and the load, to thereby limit the current flow to the load to a very small leakage value until a threshold voltage value is reached to switch said device from a high impedance to a low impedance state, with a fast rise time of the current pulse to a high value, the voltage across said device dropping to a low holding value; and said device returning to the high impedance state responsive to the voltage across it becoming less than the holding value as the pulse from the pulse source terminates; and a trigger pulse source coupled to superimpose a high voltage across said device to trigger it to said low impedance state.

2. Pulse sharpening means according to claim 1, wherein the metal oxide of said device is $NbO_x$, the value of x being in the range from approximately 2 extending downward into nonstoichiometric values.

3. Pulse sharpening means according to claim 2, wherein the threshold voltage is in the range from approximately 60 volts to several kilovolts, and the current flow in the low impedance state is in the range from several amperes to hundreds of amperes.

4. Pulse sharpening means according to claim 2, further including trigger control means to time the occurence of the pulse from said trigger pulse source with respect to the pulse from said main pulse source.

5. Pulse sharpening means according to claim 4, having at least two of said metal oxide threshold switch devices connected in series, with said trigger pulse source coupled to the junction between said devices.

6. Pulse sharpening means according to claim 5, having more than two of said metal oxide threshold switch devices connected in series, and having two trigger pulse sources of opposite polarity, with one trigger pulse source coupled to alternate junction points between the devices, and the other coupled to the remaining alternate junction points between the devices.

7. Threshold switching means comprising at least two metal oxide threshold switch devices connected in series, and a trigger pulse source coupled to the junction between said devices, the devices being of a type which switch from a high impedance state to a low impedance state in response to a voltage exceeding a threshold value, the voltage dropping to a holding value in the low impedance state with a large current flow, and the device returning to the high impedance state in response to a voltage below the holding value.

8. Threshold switching means according to claim 7, wherein the metal oxide of said devices is $NbO_x$, the value of x being in the range from approximately 2 extending downwardly into nonstoichiometric values.

9. Threshold switching means according to claim 7, having more than two of said metal oxide threshold switch devices connected in series, and having two trigger pulse sources of opposite polarity, with one trigger pulse source coupled to alternate junction points between the devices, and the other coupled to the remaining alternate junction points between the devices.

10. Threshold switching means according to claim 9, wherein the metal oxide of said devices is $NbO_x$, the value of x being in the range from approximately 2 extending downwardly into nonstoichiometric values.

* * * * *